(12) United States Patent
Lu

(10) Patent No.: US 12,446,415 B2
(45) Date of Patent: Oct. 14, 2025

(54) DISPLAY PANEL AND DISPLAY DEVICE

(71) Applicant: WUHAN CHINA STAR OPTOELECTRONICS TECHNOLOGY CO., LTD., Wuhan (CN)

(72) Inventor: Yantao Lu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 827 days.

(21) Appl. No.: 17/051,980

(22) PCT Filed: Aug. 24, 2020

(86) PCT No.: PCT/CN2020/110767
§ 371 (c)(1),
(2) Date: Oct. 30, 2020

(87) PCT Pub. No.: WO2022/032718
PCT Pub. Date: Feb. 17, 2022

(65) Prior Publication Data
US 2023/0098663 A1 Mar. 30, 2023

(30) Foreign Application Priority Data

Aug. 11, 2020 (CN) .......................... 202010802066.7

(51) Int. Cl.
*H10K 59/131* (2023.01)
(52) U.S. Cl.
CPC ................................. *H10K 59/131* (2023.02)

(58) Field of Classification Search
CPC .. H10K 59/131; G02F 1/13452; H05K 1/189; H05K 2201/09781; H05K 2201/10128; H05K 1/118
See application file for complete search history.

(56) References Cited

U.S. PATENT DOCUMENTS 8,877,630 B1 * 11/2014 Cheng .................... H01L 24/13
205/253
2006/0078021 A1 * 4/2006 Fujihara .............. H01S 5/02253
372/43.01

(Continued)

FOREIGN PATENT DOCUMENTS

CN 206742520 U 12/2017
CN 109683365 A 4/2019

(Continued)

OTHER PUBLICATIONS

International Search Report in International application No. PCT/CN2020/110767, mailed on Apr. 28, 2021.

(Continued)

*Primary Examiner* — Brian Turner
(74) *Attorney, Agent, or Firm* — PV IP PC; Wei Te Chung

(57) ABSTRACT

The present application discloses a display panel and a display device. The display panel includes a display substrate and a flexible circuit board, and further including: a chip disposed on the display substrate on a side of a display area; bonding pads disposed on the display substrate and located on at least one of left and right sides of the chip; and virtual bonding pads disposed on the display substrate on a side of the bonding pads.

9 Claims, 3 Drawing Sheets

(56) References Cited

U.S. PATENT DOCUMENTS

| | | | | |
|---|---|---|---|---|
| 2011/0032687 | A1* | 2/2011 | Song | H05K 3/361 |
| | | | | 361/803 |
| 2012/0256199 | A1* | 10/2012 | Lee | G02F 1/13452 |
| | | | | 438/34 |
| 2015/0103500 | A1* | 4/2015 | Bae | H05K 1/111 |
| | | | | 228/102 |
| 2015/0332644 | A1* | 11/2015 | Fujikawa | G09G 3/3611 |
| | | | | 345/100 |
| 2017/0263689 | A1 | 9/2017 | Nishikawa | |
| 2018/0063962 | A1* | 3/2018 | Lee | G02F 1/13452 |
| 2019/0059156 | A1* | 2/2019 | Kwon | H05K 1/118 |
| 2020/0135062 | A1 | 4/2020 | Yan | |
| 2020/0135821 | A1* | 4/2020 | Seo | H10K 77/111 |
| 2020/0166814 | A1* | 5/2020 | Guan | G02F 1/13452 |
| 2020/0210041 | A1 | 7/2020 | Liu | |
| 2021/0109616 | A1* | 4/2021 | Park | H10K 59/122 |
| 2021/0351262 | A1* | 11/2021 | Kim | H10K 59/88 |

FOREIGN PATENT DOCUMENTS

| | | | |
|---|---|---|---|
| CN | 208705626 | U | 4/2019 |
| CN | 109785750 | A | 5/2019 |
| CN | 109994042 | A | 7/2019 |
| CN | 110018598 | A | 7/2019 |
| CN | 110062524 | A | 7/2019 |
| CN | 110286535 | A | 9/2019 |
| CN | 110579917 | A | 12/2019 |
| CN | 110660319 | A | 1/2020 |
| CN | 110687728 | A | 1/2020 |
| CN | 209911692 | U | 1/2020 |
| CN | 210168287 | U | 3/2020 |
| CN | 210223406 | U | 3/2020 |
| CN | 111025793 | A | 4/2020 |
| JP | 2012141558 | A | 7/2012 |
| JP | 2015204458 | A | 11/2015 |
| JP | 2016075896 | A | 5/2016 |
| JP | 2019008106 | A | 1/2019 |
| JP | 2020003777 | A | 1/2020 |
| WO | 2020032340 | A1 | 2/2020 |

OTHER PUBLICATIONS

Written Opinion of the International Searching Authority in International application No. PCT/CN2020/110767, mailed on Apr. 28, 2021.
Chinese Office Action issued in corresponding Chinese Patent Application No. 202010802068.7 dated Mar. 22, 2021, pp. 1-9.
Chinese Office Action issued in corresponding Chinese Patent Application No. 202010802068.7 dated Aug. 27, 2021, pp. 1-6.
Chinese Decision of Rejection issued in corresponding Chinese Patent Application No. 202010802068.7 dated Dec. 30, 2021, pp. 1-6.
Japanese Office Action issued in corresponding Japanese Patent Application No. 2021-520592 dated Dec. 5, 2022, pp. 1-4.
Japanese Office Action issued in corresponding Japanese Patent Application No. 2021-520592 dated May 8, 2023, pp. 1-4.
Korean Office Action issued in corresponding Korean Patent Application No. 10-2021-7030900 dated Dec. 12, 2022, pp. 1-6.
Japanese Office Action issued in corresponding Japanese Patent Application No. 特願2021-520592 dated Oct. 30, 2023, pp. 1-5.
Japanese Office Action issued in corresponding Japanese Patent Application No. 特願2021-520592 dated May 24, 2024, pp. 1-3.
European Office Action issued in corresponding European Patent Application No. 20885393.7 dated Jul. 30, 2024, pp. 1-7.

* cited by examiner

DISPLAY PANEL AND DISPLAY DEVICE

BACKGROUND OF INVENTION

Field of Invention

The present application relates to the field of display panels, and in particular to a display panel and a display device.

Description of Prior Art

Due to a continuously increased screen-to-body ratio of the current display screen, a border of the display needs to be narrower and narrower. Referring to FIG. 1, FIG. 1 shows a schematic structural diagram of a display panel provided in the prior art. The display panel 100 includes a display substrate 10, a display area 20, a fan-out area 30, a chip 40, bonding pads 50, gold fingers 70, and a flexible circuit board 60. The chip 40 is arranged on the display substrate 10 at a side of the display area 20, the bonding pads 50 are arranged on the display substrate 10 and located on left and right sides of the chip 40, and the gold fingers 70 are arranged on the flexible circuit board 60 and correspondingly connected to surfaces of the bonding pads 50. Because a number of bonding pads on opposite sides of the chip is small, a contact area between the entire flexible circuit board and the display substrate is small, which may cause the flexible circuit board to be pulled out when the flexible circuit board is pulled.

Therefore, there is a need to develop a new type of display panel to overcome the defects of the prior art.

SUMMARY OF INVENTION

An object of the present invention is to provide a display panel, which can solve the problem of a small contact area between the flexible circuit board and the display substrate in the prior art.

To achieve the above objective, the present invention provides a display panel, including a display substrate and a flexible circuit board, and further including: a chip disposed on the display substrate on a side of a display area; bonding pads disposed on the display substrate and located on at least one of left and right sides of the chip; dummy bonding pads disposed on the display substrate on a side of the bonding pads; gold fingers disposed on the flexible circuit board and correspondingly connected to surfaces of the bonding pads; and dummy gold fingers disposed on the flexible circuit board on a side of the gold fingers and correspondingly connected to a surface of the dummy bonding pads.

The dummy bonding pads are added to the side of the bonding pads, some dummy gold fingers are added to corresponding positions of the flexible circuit board, and the surfaces of the dummy bonding pads and the surfaces of the dummy gold fingers are in contact with each other in one-to-one correspondence, such that the contact area between the flexible circuit board and the display panel is increased, thereby increasing a pulling force of the flexible circuit board.

Further, in other embodiments, the bonding pads are connected to the chip through leads disposed therebetween.

Further, in other embodiments, no lead is disposed between the dummy bonding pads and the chip.

Further, in other embodiments, the display panel further includes: a cathode lead connecting the chip to each column of a plurality of columns of pixels in the display area; and an anode lead connecting the chip to each row of a plurality of rows of the pixels in the display area.

Further, in other embodiments, the display panel further includes: a conductive adhesive film configured to connect the bonding pads to the gold fingers by lamination.

Further, in other embodiments, a number of the gold fingers is the same as a number of the bonding pads, the number of the bonding pads is more than two, the bonding pads are isolated from each other, and the gold fingers are isolated from each other.

Further, in other embodiments, each of the bonding pads has a rectangular shape.

Further, in other embodiments, the bonding pads are arranged in a direction perpendicular to a lengthwise direction of the bonding pads.

Further, in other embodiments, a number of the dummy gold fingers is the same as a number of the dummy bonding pads, the number of the dummy bonding pads is more than two, the dummy bonding pads are isolated from each other, and the dummy gold fingers are isolated from each other.

A distance between adjacent ones of the bonding pads is preferably 0.4 mm, and a distance between adjacent ones of the golden fingers is preferably 0.4 mm.

Further, in other embodiments, the bonding pads are rectangular.

Further, in other embodiments, the bonding pads are arranged in a direction perpendicular to a lengthwise direction of the bonding pads.

Further, in other embodiments, a shape of each of the bonding pads may be an ellipse or a polygon, which is not particularly limited herein.

Each of the bonding pads and the dummy bonding pads has the same size with a width of preferably 4 mm and a length of preferably 9 mm.

Further, in other embodiments, a number of the dummy gold fingers is the same as a number of the dummy bonding pads, the number of the dummy bonding pads is more than two, the dummy bonding pads are isolated from each other, and the dummy gold fingers are isolated from each other.

Further, in other embodiments, the flexible circuit board is Y-shaped.

Further, in other embodiments, the flexible circuit board includes a main body and a connection end, and the golden fingers and the dummy golden fingers are all provided at the connection end.

In order to achieve the above object, the present invention also provides a display device, including the display panel of the present invention.

Compared with the prior art, the beneficial effect of the present invention is that the present invention provides a display panel and a display device, wherein the dummy bonding pads are added to the side of the bonding pads, some dummy gold fingers are added to corresponding positions of the flexible circuit board, and the surfaces of the dummy bonding pads and the surfaces of the dummy gold fingers are in contact with each other in one-to-one correspondence, such that the contact area between the flexible circuit board and the display panel is increased, thereby increasing a pulling force of the flexible circuit board.

BRIEF DESCRIPTION OF DRAWINGS

The following describes the specific implementations of the present application in detail with reference to the accompanying drawings, which will make the technical solutions and other beneficial effects of the present application obvious.

Figure 1:
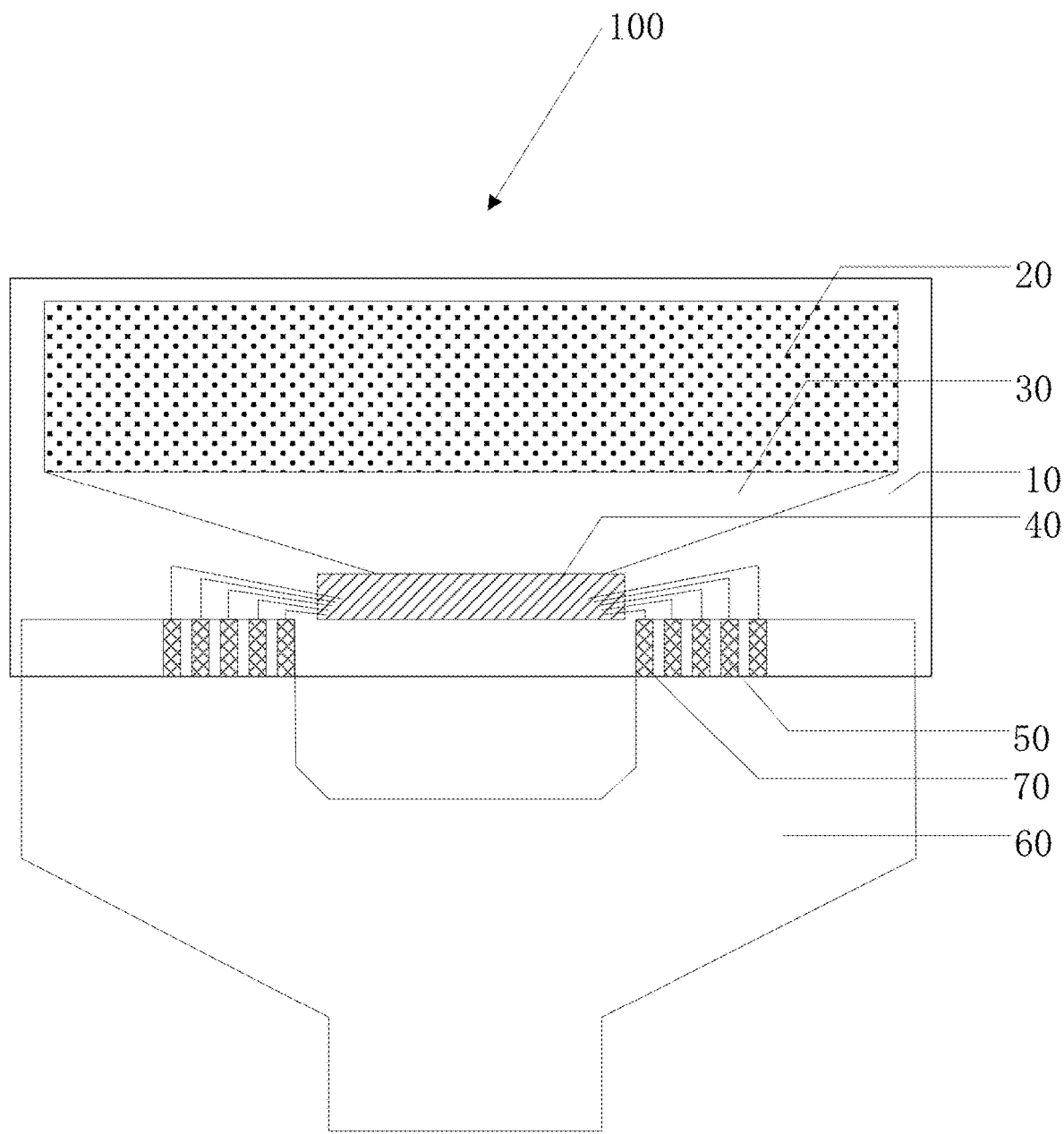
FIG. 1 is a schematic structural diagram of a display panel provided in the prior art.

Elements of the prior art in the drawings are designated by reference numerals listed below.

display panel—100; display substrate—10;
display area—20; fan-out area—30;
chip—40; bonding pad—50;
flexible circuit board—60; gold finger—70.

Elements of the present embodiments in the drawings are designated by reference numerals listed below.

display panel—100; display substrate—10;
display area—20; fan-out area—30;
chip—40; bonding pad—50;
flexible circuit board—60; gold finger—70;
dummy pad—51; dummy gold finger—71;
lead—80; flexible circuit board body—61;
connection end—62.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for realizing different structures of the present application. To simplify the disclosure of the present application, the components and settings of specific examples are described below. Of course, they are only examples and are not intended to limit The present application. In addition, the present application may repeat reference numerals and/or reference letters in different examples. Such repetition is for the purpose of simplification and clarity, and does not indicate the relationship between the various embodiments and/or settings discussed. In addition, The present application provides examples of various specific processes and materials, but those of ordinary skill in the art may be aware of The present applications of other processes and/or the use of other materials.

Figure 2:
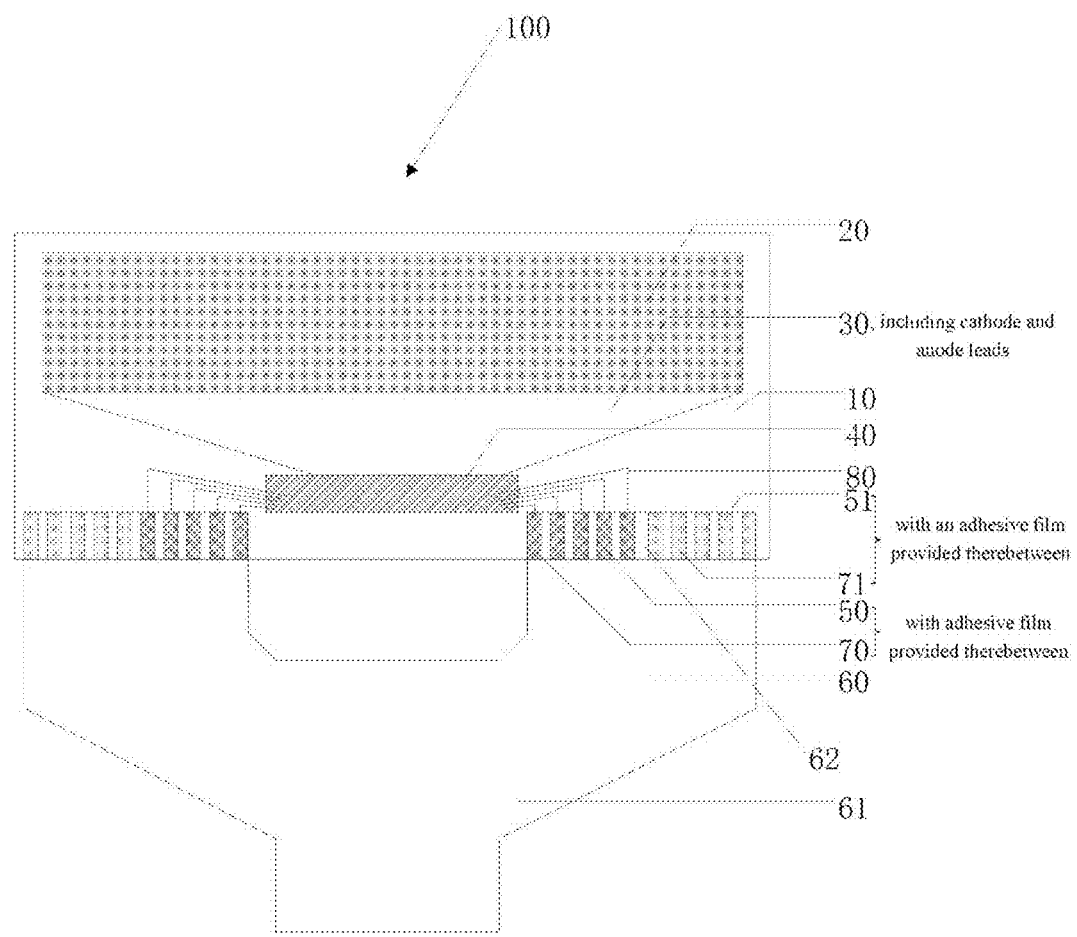
FIG. 2 is a schematic structural diagram of a display panel provided by an embodiment of the present invention.

Referring to FIG. 2, which is a schematic structural diagram of a display panel provided by an embodiment of the present invention. The display panel 100 includes a display substrate 10 and a flexible circuit board 60. The display substrate 10 includes a display area 20, a fan-out area 30, a chip 40, bonding pads 50, and dummy bonding pads 51.

Figure 3:
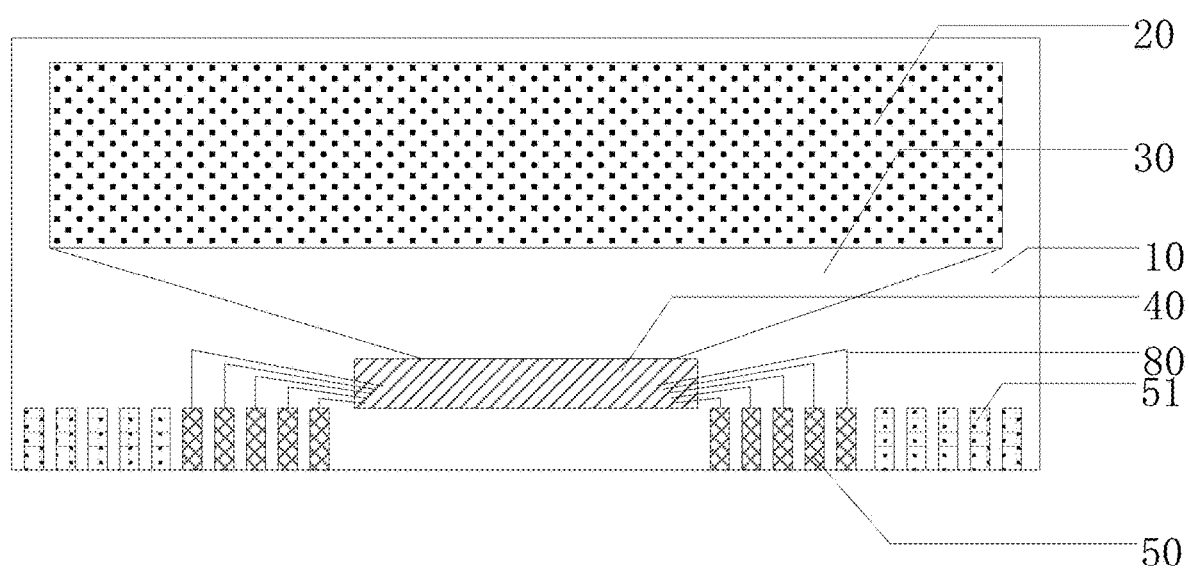
FIG. 3 is a schematic diagram of the structure of a display substrate provided by an embodiment of the present invention.

Referring to FIG. 3, which is a schematic structural diagram a display substrate provided by an embodiment of the present invention. The chip 40 is disposed on the display substrate 10 on a side of the display area 20, the bonding pads 50 are disposed on the display substrate 10 and located on the left and right sides of the chip 40, and the dummy bonding pads 51 are disposed on the display substrate 10 on a side of the bonding pads 50.

In this embodiment, each of the bonding pads 50 has a rectangular shape, and the bonding pads 50 are arranged in a direction perpendicular to a lengthwise direction of the bonding pads 50. Each of the dummy bonding pads 51 has a rectangular shape, and dummy bonding pads 51 are arranged in the direction perpendicular to the lengthwise direction of the bonding pads 50.

In other embodiments, a shape of each of the bonding pads may be an ellipse or a polygon, which is not particularly limited herein.

In this embodiment, each of the bonding pads 50 and the dummy bonding pads 51 has the same size with a width of preferably 4 mm and a length of preferably 9 mm. Compared with the bonding pad of the prior art with a width of 6 mm and a length of 6 mm, each of the bonding pads 50 has a decreased width and a current-carrying area remaining unchanged.

In this embodiment, each of the gold fingers 70 and each of the dummy gold fingers 71 has the same size with a width of preferably 4 mm and a length of preferably 9 mm.

The fan-out area 30 includes cathode leads and anode leads, wherein each of the cathode leads has one end connected to the chip 40 and another end connected to each column of a plurality of columns of pixels in the display area 20; and each of the anode leads has one end connected to the chip 40 and another end connected to each row of a plurality of rows of the pixels in the display area 20.

In other embodiments, a position of each of the cathode leads and a position of each of the anode leads can also be interchanged, that is, each of the anode leads has one end connected to the chip 40 and another end connected to each column of a plurality of columns of pixels in the display area 20; and each of the cathode leads has one end connected to the chip 40 and another end connected to each row of a plurality of rows of the pixels in the display area 20.

Figure 4:
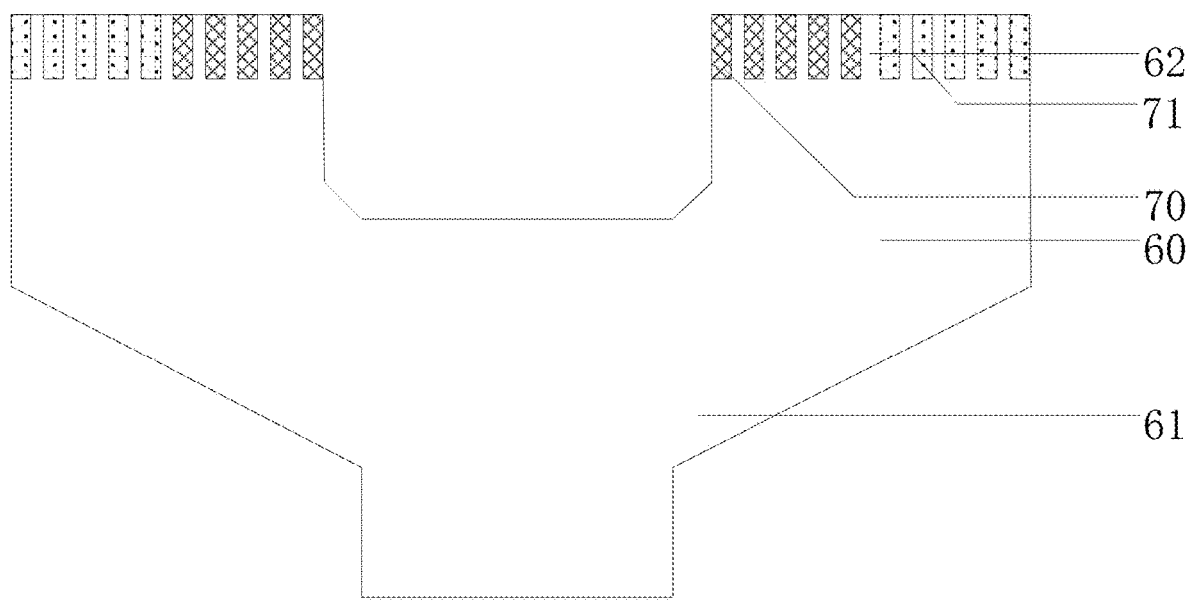
FIG. 4 is a schematic structural diagram of a flexible circuit board provided by an embodiment of the present invention.

Referring to FIG. 4, which is a schematic structural diagram of a flexible circuit board provided by an embodiment of the present invention. The flexible circuit board 60 is Y-shaped. The flexible circuit board 60 includes a main body 61 and a connection end 62. The gold fingers 70 and the dummy gold fingers 71 are all provided at the connection end 62.

The gold fingers 70 are correspondingly connected to surfaces of the bonding pads; and the dummy gold fingers 71 are disposed on the flexible circuit board 60 on a side of the gold fingers 70 and correspondingly connected to surfaces of the dummy bonding pads 51.

The dummy bonding pads 51 are added to the side of the bonding pads 50, some dummy gold fingers 71 are added to corresponding positions of the flexible circuit board 60, and the surfaces of the dummy bonding pads 51 and the surfaces of the dummy gold fingers 71 are in contact with each other in one-to-one correspondence, such that the contact area between the flexible circuit board 60 and the display panel 100 is increased, thereby increasing a pulling force of the flexible circuit board 60.

The bonding pads 50 are connected to the chip 40 through leads 80 disposed therebetween.

No lead is disposed between the dummy bonding pads 51 and the chip 40. Because the dummy bonding pads 51 are configured to increase the contact area between the flexible circuit board 60 and the display panel 100, the dummy bonding pads 51 do not need to function electrically effect.

A conductive adhesive film is also arranged between the bonding pads 50 and the gold fingers 70, and the bonding pads 50 and the gold fingers 70 are connected to each other through the conductive adhesive film by lamination. In other embodiments, the conductive adhesive film further includes a conductive gold ball, and the bonding pads 50 and the gold fingers 70 are electrically connected to each other through the conductive gold ball.

An adhesive film is also provided between the dummy bonding pads 51 and the dummy gold fingers 71, but no conductive gold ball is provided therebetween. There is no need for electrical connection between the dummy bonding pads 51 and the dummy gold fingers 71, as long as the contact area between the flexible circuit board 60 and the display panel 100 can be increased by corresponding adhesion.

A number of the gold fingers 70 is the same as a number of the bonding pads 50, the number of the bonding pads 50 is more than two, the bonding pads 50 are isolated from each other, and the gold fingers 701 are isolated from each other. A distance between adjacent ones of the bonding pads 50 is preferably 0.4 mm, and a distance between adjacent ones of the gold fingers 70 is preferably 0.4 mm.

A number of the dummy gold fingers 71 is the same as a number of the dummy bonding pads 51, the number of the dummy bonding pads 51 is more than two, the dummy bonding pads 51 are isolated from each other, and the dummy gold fingers 71 are isolated from each other. A distance between adjacent ones of the dummy bonding pads 51 is preferably 0.4 mm, and a distance between adjacent ones of the dummy gold fingers 71 is preferably 0.4 mm.

In order to achieve the above objective, the present invention also provides a display device, including the display panel 100 related to the present invention.

The beneficial effects of the present invention are: the present invention provides a display panel and a display device, wherein the dummy bonding pads 51 are added to the side of the bonding pads 50, some dummy gold fingers 71 are added to corresponding positions of the flexible circuit board 60, and the surfaces of the dummy bonding pads 51 and the surfaces of the dummy gold fingers 71 are in contact with each other in one-to-one correspondence, such that the contact area between the flexible circuit board 60 and the display panel 100 is increased, thereby increasing a pulling force of the flexible circuit board 60.

In the above embodiments, the descriptions of each embodiment have their own emphasis. The parts that are not described in detail in an embodiment can be referred to the detailed descriptions in other embodiments above, which will not be repeated herein for brevity.

The display panel and the display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising a display substrate and a flexible circuit board, and further comprising: a chip disposed on the display substrate on a side of a display area; bonding pads disposed on the display substrate and located on at least one of left and right sides of the chip; dummy bonding pads disposed on the display substrate on a side of the bonding pads; gold fingers disposed on the flexible circuit board and correspondingly connected to surfaces of the bonding pads; and dummy gold fingers disposed on the flexible circuit board on a side of the gold fingers and correspondingly connected to a surface of the dummy bonding pads, wherein an adhesive film is disposed between the dummy bonding pads and the dummy gold fingers, the bonding pads and the gold fingers being laminated through a conductive adhesive film, one of the dummy bonding pads is in close proximity to one of the bonding pads, with only a gap therebetween, wherein the gap does not include any electrical components or non-electrically active components, wherein a width and a length of each of the bonding pads and the dummy bonding pads are 4 mm and 9 mm, respectively, and a width and a length of the gold fingers and the dummy gold fingers are 4 mm and 9 mm, respectively, wherein a distance between adjacent ones of the bonding pads is 0.4 mm, and a distance between adjacent ones of the gold fingers is 0.4 mm.

2. The display panel according to claim 1, wherein the bonding pads are connected to the chip through leads disposed therebetween.

3. The display panel according to claim 1, wherein no lead is disposed between the dummy bonding pads and the chip.

4. The display panel according to claim 1, further comprising:
a cathode lead connecting the chip to each column of a plurality of columns of pixels in the display area; and
an anode lead connecting the chip to each row of a plurality of rows of the pixels in the display area.

5. The display panel according to claim 1, wherein a number of the gold fingers is the same as a number of the bonding pads, the number of the bonding pads is more than two.

6. The display panel according to claim 1, wherein each of the bonding pads has a rectangular shape.

7. The display panel according to claim 1, wherein the bonding pads are arranged in a direction perpendicular to a lengthwise direction of the bonding pads.

8. The display panel according to claim 1, wherein a number of the dummy gold fingers is the same as a number of the dummy bonding pads, the number of the dummy bonding pads is more than two, the dummy bonding pads are isolated from each other, and the dummy gold fingers are isolated from each other.

9. The display panel according to claim 1, wherein the adhesive film is non-conductive.

* * * * *